(12) United States Patent
Kim et al.

(10) Patent No.: US 7,110,319 B2
(45) Date of Patent: Sep. 19, 2006

(54) MEMORY DEVICES HAVING REDUCED COUPLING NOISE BETWEEN WORDLINES

(75) Inventors: Tae H. Kim, Boise, ID (US); Charles L. Ingalls, Meridian, ID (US); Howard C. Kirsch, Eagle, ID (US); Jeremy J. Gum, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 5 days.

(21) Appl. No.: 10/928,034

(22) Filed: Aug. 27, 2004

(65) Prior Publication Data

US 2006/0044921 A1    Mar. 2, 2006

(51) Int. Cl.
*G11C 8/00*    (2006.01)
(52) U.S. Cl. ............... 365/230.06; 365/206; 365/214; 365/230.04; 365/230.02; 365/63
(58) Field of Classification Search ........... 365/230.06, 365/206, 214, 230.04, 230.02, 63
See application file for complete search history.

(56) References Cited

U.S. PATENT DOCUMENTS

| 5,097,441 | A | * | 3/1992 | Cho et al. ................ 365/51 |
| 5,159,572 | A | * | 10/1992 | Morton ................ 365/230.06 |
| 5,208,782 | A | * | 5/1993 | Sakuta et al. .......... 365/230.03 |
| 5,461,587 | A | * | 10/1995 | Oh ............................. 365/200 |
| 5,513,142 | A | | 4/1996 | Arimoto et al. ....... 365/189.11 |
| 5,574,698 | A | | 11/1996 | Raad ..................... 365/230.06 |
| 5,774,412 | A | | 6/1998 | Raad et al. ............. 365/230.06 |
| 6,449,195 | B1 | * | 9/2002 | Min et al. ............. 365/189.05 |
| 6,501,672 | B1 | | 12/2002 | Sekiguchi et al. ............ 365/72 |
| 6,549,445 | B1 | | 4/2003 | Ooishi et al. .................. 365/63 |
| 6,556,503 | B1 | * | 4/2003 | Schreck ................ 365/230.06 |
| 6,816,410 | B1 | * | 11/2004 | Kleveland et al. ..... 365/185.03 |
| 6,876,567 | B1 | * | 4/2005 | Chow ......................... 365/145 |
| 6,879,505 | B1 | * | 4/2005 | Scheuerlein ................. 365/51 |
| 6,894,941 | B1 | * | 5/2005 | Kurjanowicz et al. ...... 365/222 |

FOREIGN PATENT DOCUMENTS

| EP | 000169460 A2 | * | 1/1986 |
| JP | 02000036197 A | * | 2/2000 |

* cited by examiner

*Primary Examiner*—Viet Q. Nguyen
(74) *Attorney, Agent, or Firm*—Fletcher Yoder

(57) ABSTRACT

Memory devices configured to reduce coupling noise between adjacent wordlines in a memory array. More specifically, wordline drivers are interleaved such that adjacent wordlines are driven by wordline drivers enabled by different row decoders. Each wordline driver includes a weak transistor to ground and a strong transistor to ground. By disabling the wordline driver on the wordlines directly adjacent to the active wordlines, a path is provided to drive the coupling noise from the active wordline to ground through the strong transistor.

21 Claims, 5 Drawing Sheets

MEMORY DEVICES HAVING REDUCED COUPLING NOISE BETWEEN WORDLINES

BACKGROUND OF THE INVENTION

1. Field of the Invention

The present invention generally relates to integrated circuits and, more particularly, to memory devices configured to reduce coupling noise between adjacent wordlines in a memory array.

2. Description of the Related Art

This section is intended to introduce the reader to various aspects of art, which may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

A wide variety of integrated circuit devices are available for storing data in systems such as computer systems. One type of commonly used memory device is a Dynamic Random Access Memory (DRAM) device. A DRAM memory cell typically includes an access device, such as a transistor, coupled to a storage device, such as a capacitor. The access device allows the transfer of charge to and from the storage capacitor. The data is stored in a binary format; a logical "1" is stored as a charged a capacitor, and a logical "0" is stored as a discharged capacitor. A typical DRAM device is arranged in a plurality of addressable rows and columns which form a memory array. To access a memory cell, a particular row or "wordline" and a particular column or "bitline" may be implemented.

With the constantly increasing demand for higher data storage capacity, memory arrays are becoming more dense. Memory density is typically limited by current processing technologies used for fabrication of the memory arrays. Disadvantageously, as the density of memory arrays increase, other aspects of the memory array, such as electrical characteristics, may also be affected. For instance, coupling noise between adjacent wordlines may have a greater impact on device performance as the device density increases. Disadvantageously, the increased coupling noise between adjacent wordlines may negatively impact device performance and increase current leakage as well as the occurrence of soft errors which may alter the data storage in the memory cells.

Embodiments of the present invention may address one or more of the problems set forth above.

BRIEF DESCRIPTION OF THE DRAWINGS

Advantages of the invention may become apparent upon reading the following detailed description and upon reference to the drawings in which:

FIG. 3 is a schematic drawing illustrating an exemplary Dynamic Random Access Memory (DRAM) cell;

FIG. 4 is a schematic drawing illustrating an exemplary wordline driver circuit that may be implemented in accordance with embodiments of the present invention;

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
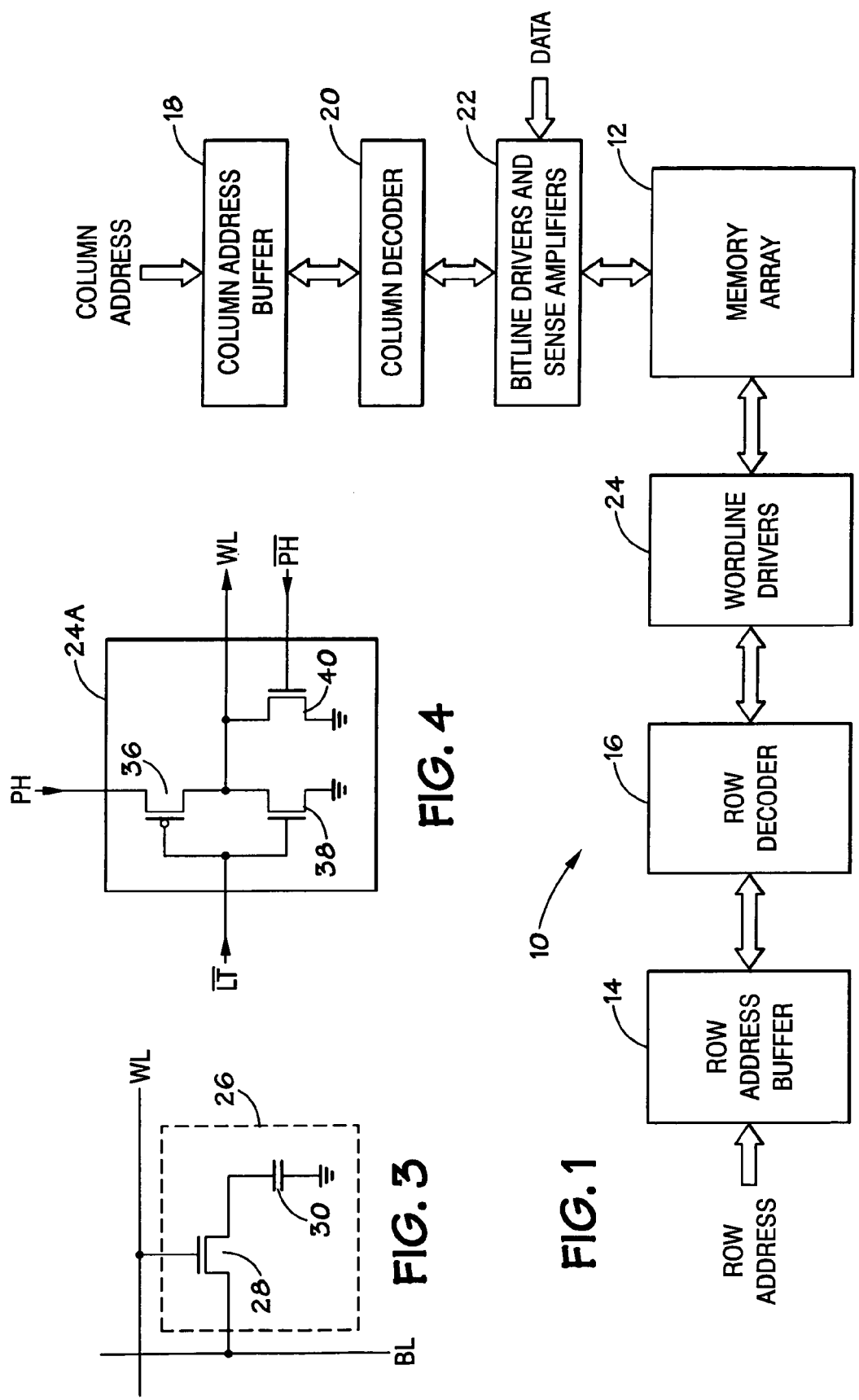
FIG. 1 illustrates a block diagram of a portion of a memory device that may be fabricated in accordance with embodiments of the present invention.

Referring initially to FIG. 1, a block diagram of a portion of a memory device 10 is illustrated. The memory device 10 may be, for example, a Dynamic Random Access Memory (DRAM) device. The memory device 10 includes a memory array 12 having a number of memory cells arranged in a grid pattern comprising a number of rows and columns. The number of memory cells (and corresponding rows and columns) may vary depending on system requirements and device specifications.

As previously described, the columns or "bitlines" BL are implemented to read and write data to the memory array 12. The "wordlines" WL are implemented to access a particular row of the memory array 12. Accordingly, the memory device 10 includes a row address buffer 14, row decoder 16, column address buffer 18 and column decoder 20. The row address buffer 14 controls the row decoder 16, and the column address buffer 18 controls the column decoder 20. The row decoder 16 and column decoder 20 selectively access memory cells in the memory array 12 in response to address signals that are provided during read, write and refresh operations. The address signals are typically provided by an external controller such as a microprocessor or other memory controller.

In one exemplary mode of operation, the memory device 10 receives an address corresponding to a particular memory cell in the memory array 12 at each of the row address buffer 14 and the column address buffer 18. The row address buffer 14 identifies one of the wordlines WL of the particular memory cell in the memory array 12 corresponding to the requested address and passes the address to the row decoder 16. The row decoder 16 selectively activates the particular wordline WL to activate the access device for each memory cell in the memory array 12 connected to the selected wordline WL. The column address buffer 18 identifies the bitline BL at the particular memory cell corresponding to the requested address and passes the address to the column decoder 20. The column decoder 20 selects the bitline (or bitlines) BL of the memory cell in the memory array 12 corresponding to the requested address.

The column decoder 20 is coupled to the bitline drivers and sense amplifiers 22. The bitline drivers and sense amplifiers 22 sense a differential voltage between bitline pairs (BL and $\overline{BL}$) and drive the bitlines (columns) to full power rails in response thereto. Wordline drivers 24 are provided between the row decoder 16 and the memory array 12 to activate a selected wordline in the memory array 12 according to the selected row address. The row decoder 16, wordline drivers 24 and the general operation of the memory device 10 will be described in more detail with reference to FIG. 2 below.

Figure 2:
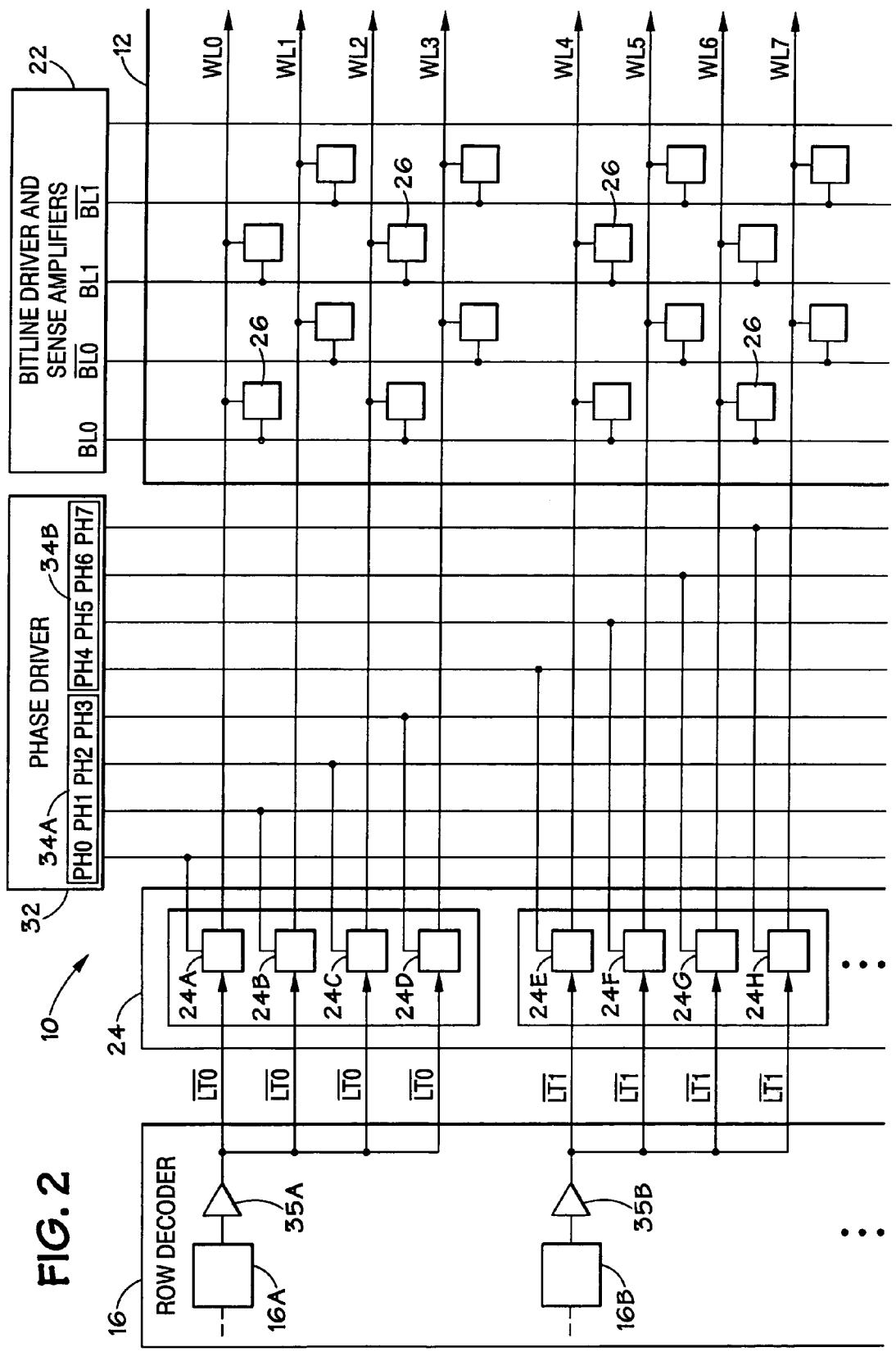
FIG. 2 illustrates a more detailed block diagram of a portion of a memory device.

Referring now to FIG. 2, a more detailed block diagram of an exemplary memory device 10 is illustrated. As previously described, the memory array 12 generally includes a number of memory cells 26. Each of the memory cells is coupled to a respective wordline WL and a respective bitline BL or a complementary bitline $\overline{BL}$. If the memory device 10 is a DRAM device, each memory cell 26 will include an access device and a storage device. Referring briefly to FIG. 3, an exemplary DRAM memory cell 26 is illustrated. The exemplary embodiment of the memory cell 26 includes a field effect transistor (FET) 28 which is implemented to provide access to a storage capacitor 30. As will be appreciated, the gate of the FET 28 is coupled to a wordline WL and the drain of the FET 28 is coupled to a bitline BL (or a complementary bitline $\overline{BL}$). By controlling the gate via a voltage applied to the wordline WL, a charge on the bitline BL may be stored in the capacitor 30, as previously described.

Because each memory cell 26 is dynamic, the maximum available voltage is generally implemented to write data to the memory cell 26 to minimize the frequency of memory refresh cycles. In order to write the maximum voltage into a memory cell 26, the gate of the access transistor 28 is generally driven to a pumped voltage level, $V_{CCP}$. Returning to FIG. 2, a phase driver block 32 is generally implemented to provide the pumped voltage $V_{CCP}$ to the access FET 28 in the memory cell 26 through a respective wordline driver 24A–24H. The pumped voltage $V_{CCP}$ is generally applied through the phase lines PH0–PH7. A single phase driver may be implemented to drive a number of phase lines PH0–PH7. In the present exemplary embodiment, the phase lines PH0–PH3 are driven by one phase driver 34A, while the phase lines PH4–PH7 are driven by another phase driver 34B. As will be appreciated, driving one of the phase lines PH0–PH7 may require excessive operating current. That is, only one row at a time requires excessive the pumped voltage $V_{CCP}$. By driving only a single wordline driver 24A–24H through a respective phase line PH0–PH7, operating current can be substantially reduced.

As previously described, external address lines provided to the memory device 10 are received by the row decoder 16 which decodes the address lines to identify a selected memory row address. Because the pitch of the memory array and corresponding wordlines is very small, a separate row decoder 16 cannot be provided for each row. Accordingly, each row decoder 16 is generally coupled to a group of memory rows. In the exemplary embodiment illustrated in FIG. 2, each individual row decoder 16A and 16B is coupled to four rows through a respective wordline driver 24A–24H. An enable signal $\overline{LT0}$ is provided from the row decoder 16A to the wordline drivers 24A–24D, through the inverter 35A. Similarly, an enable signal $\overline{LT1}$ is provided from the row decoder 16B to the wordline drivers 24E–24H, through the inverter 35B. By implementing the phase lines PH0–PH7, one of the wordlines WL coupled to the group of wordlines can be connected to a pump supply voltage $V_{CCP}$ through a respective wordline driver 24A–24H.

Referring briefly to FIG. 4, an exemplary wordline driver, such as the wordline driver 24A, is illustrated. The wordline driver 24A includes a p-channel metal oxide silicon field effect transistor (MOSFET) 36 and two n-channel MOSFET transistors 38 and 40. The gates of the transistors 36 and 38 are coupled together and receive an enable signal from a respective row decoder 34, generally indicated here as $\overline{LT}$. The gate of the transistor 36 generally receives a signal from a respective phase driver, indicated here as PH. The gate of the transistor 40 generally receives the inverse of the phase driver signal, indicated here as $\overline{PH}$.

When the signal from the individual row decoder $\overline{LT}$ is low, the p-channel transistor 36 couples the wordline WL to an associated one of the phase lines PH. If the associated global phase line PH is connected to a pump voltage $V_{CCP}$, the wordline activates the access transistor 28 in the memory cell 26. When $\overline{LT}$ is high, the n-channel transistor 38 couples the wordline WL to ground and the access FET 28 is not activated. The n-channel transistor 40 is generally small compared to the transistor 38. For instance, the current capability of the n-channel transistor 38 may be at least four times greater than the current capability of the transistor 40. The transistor 40 is generally implemented to reduce the coupling noise on the wordline WL.

Figure 5:
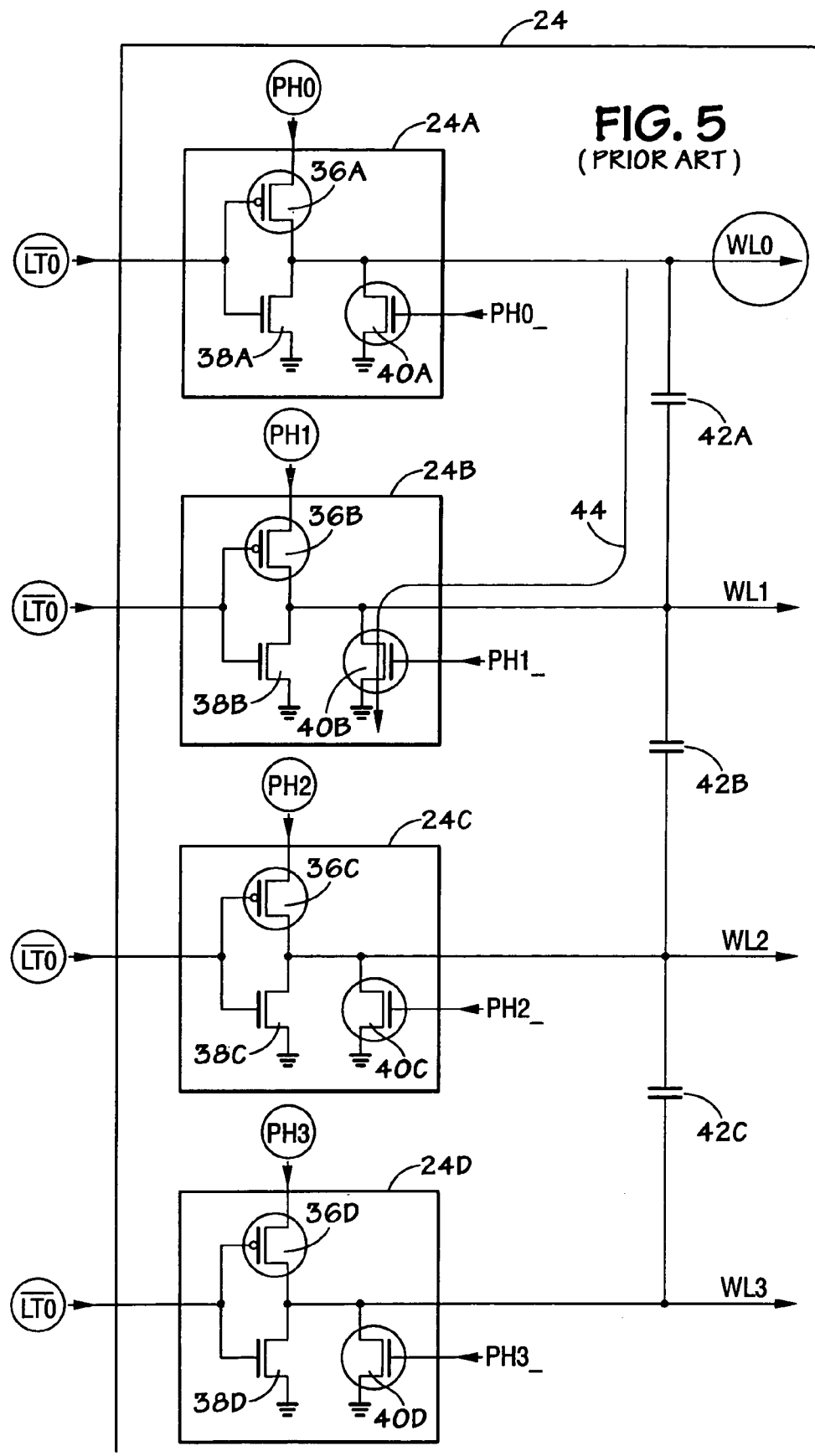
FIG. 5 is a schematic drawing illustrating wordline drivers implemented in accordance with prior techniques.

Referring now to FIG. 5, a more detailed example of a portion of the wordline driver block 24 is illustrated. As previously described, each wordline WL0–WL3 includes a respective wordline driver 24A–24D. Each wordline driver 24A–24D includes a p-channel MOS transistor 36A–36D, a first n-channel MOS transistor 38A–38D and a second n-channel MOS transistor 40A–40D. As will be appreciated, each wordline WL0–WL3 includes a parasitic capacitance 42 between adjacent wordlines. The parasitic capacitance 42A–42C varies depending on the specific design of the memory device 10. The parasitic capacitance 42A represents coupling noise between adjacent wordlines WL0 and WL1. The parasitic capacitance 42B represents coupling noise between adjacent wordlines WL1 and WL2, etc. Accordingly, when one wordline is active, an adjacent wordline may receive noise through the parasitic capacitance 42A–42C. Disadvantageously, the coupling noise may cause an unselected wordline to activate if the coupling noise becomes sufficiently large. This condition is exacerbated in densely fabricated wordline structures.

To mitigate some of the effects of the parasitic capacitance 42, the FETs 40A–40D are implemented to provide a noise sinking path to ground from an active wordline to an inactive wordline. For instance, if the wordline WL0 is selected, as indicated in FIG. 5, the corresponding condition of the inverted enable signal $\overline{LT0}$ from the row decoder 16A and the boosted voltage signal PH0–PH3 received from the phase driver 34A will cause the transistors 36A–36D and 40A–40D to be activated, as indicated in FIG. 5. Accordingly, when the wordline WL0 is active, coupling noise through the parasitic capacitance 42A will result between the wordline WL0 and the wordline WL1. By opening transistor 40B, the coupling noise on the wordline WL1 is pulled to ground through the transistor 40B, as indicated by the current dissipation path 44. Advantageously, the transistor 40B reduces or eliminates the coupling noise on the wordline WL1. However, as device designs become more dense, the coupling noise through the parasitic capacitor 42A may become too large for the small transistor 40B to sufficiently eliminate. Accordingly, an improved device configured to better handle cross coupling between adjacent wordlines is described below with reference to FIGS. 6 and 7.

Figure 6:
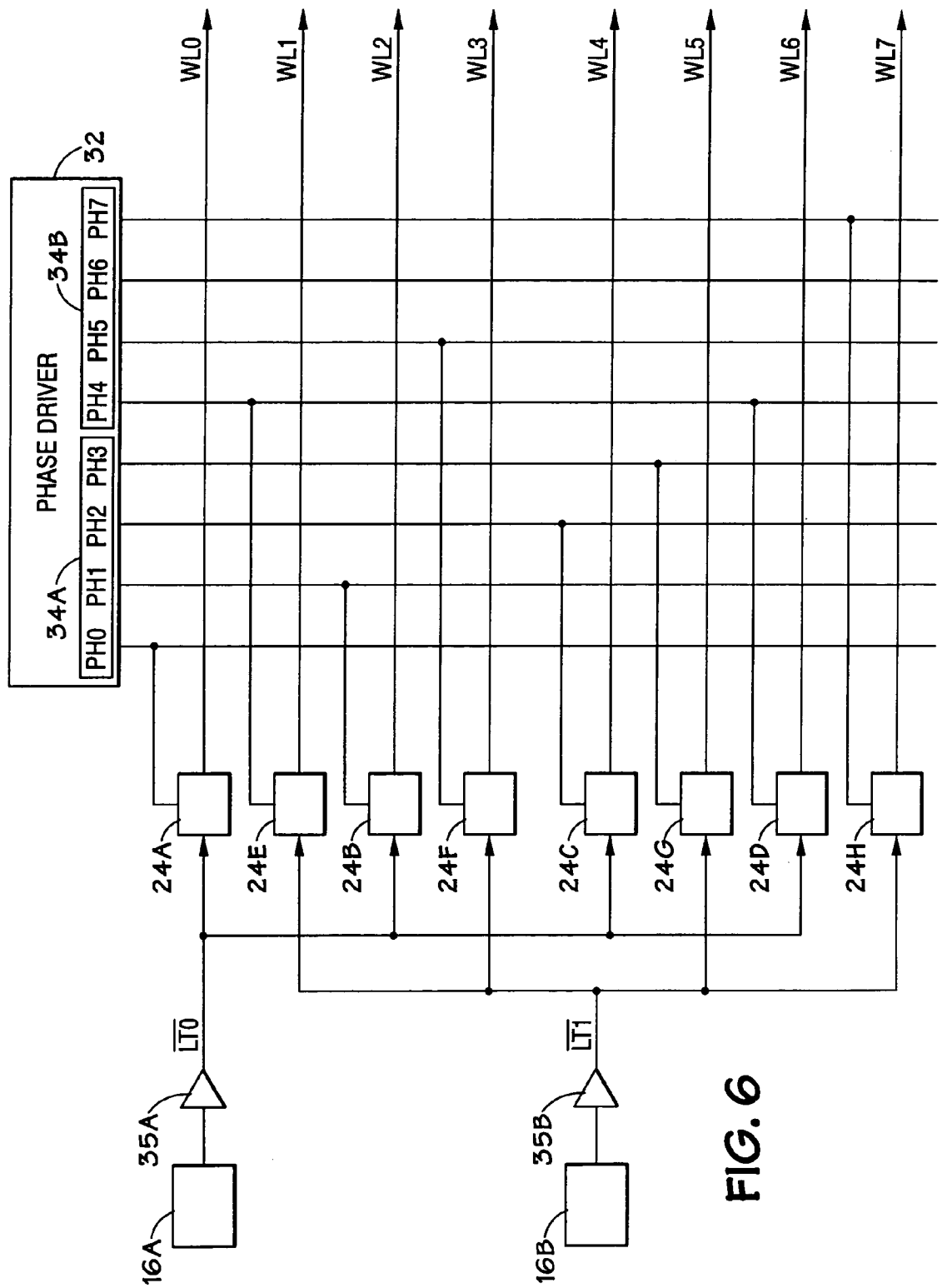
FIG. 6 is a block diagram of a portion of the memory array fabricated in accordance with embodiments of the present invention.

FIG. 6 illustrates a block diagram of a portion of the memory device 10 fabricated in accordance with embodiments of the present invention. In the present exemplary embodiment, rather than placing row drivers which are controlled through the same row decoder directly adjacent to one another, as in FIGS. 2 and 5, the placement of the row drivers 24A–24H may be such that each wordline driver 24A–24H is directly adjacent to a wordline driver 24A–24H which receives a signal from a different row decoder.

As illustrated in FIG. 6, each of the row drivers 24A–24D receives the inverted enable signal $\overline{LT0}$ from the row decoder 16A. Similarly, each of the wordline drivers 24E–24H receives the inverted enable signal $\overline{LT1}$ from the row decoder 16B. By interleaving the wordline drivers 24A–24H, as indicated in FIG. 6, the coupling noise on inactive wordlines which are located directly adjacent to an active wordline may be more effectively reduced.

Figure 7:
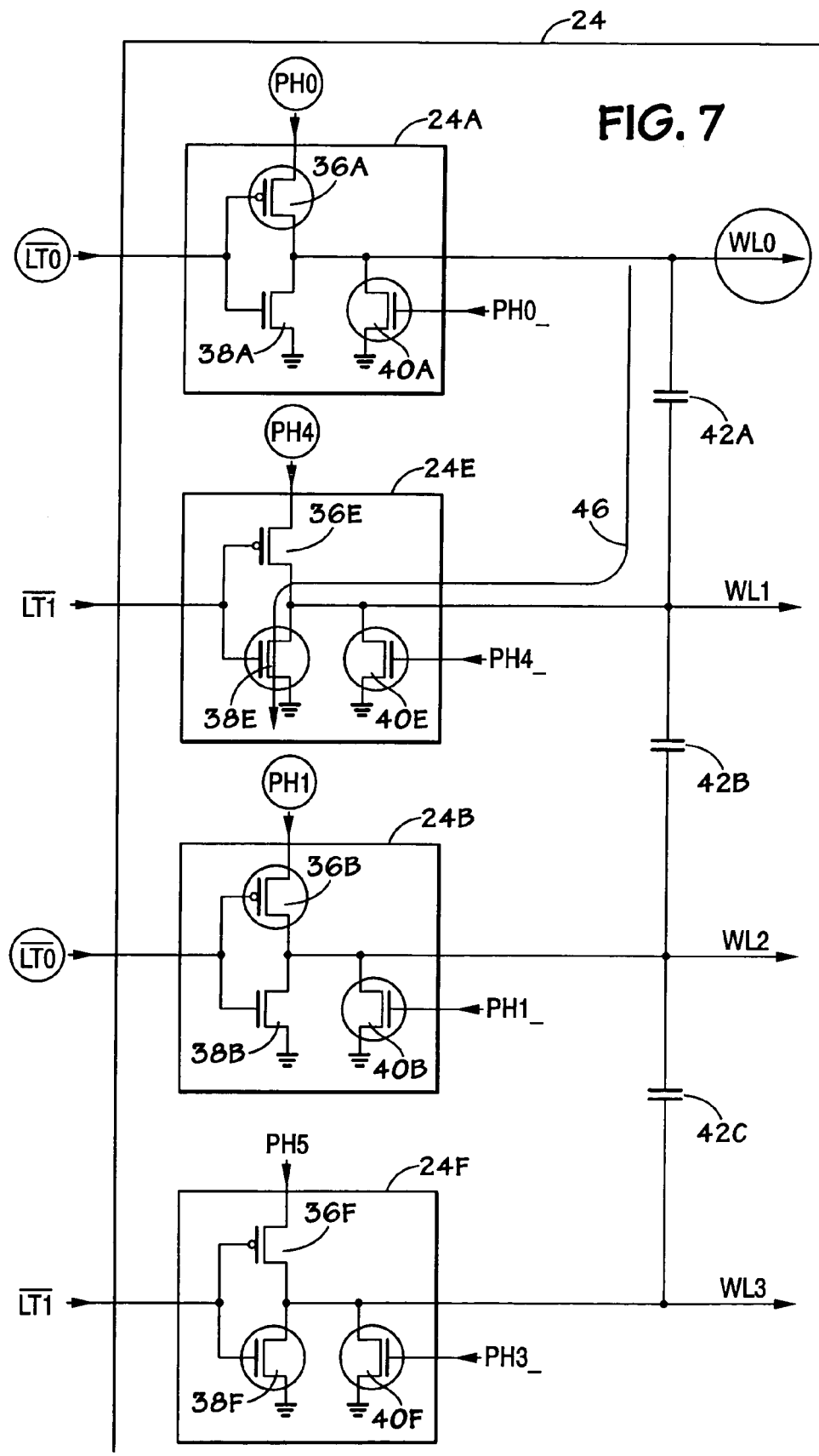
FIG. 7 is a schematic drawing illustrating wordline drivers implemented in accordance with embodiments of the present invention.

Referring now to FIG. 7, a more detailed illustration of the block diagram depicted in FIG. 6 will be discussed. As discussed with reference to FIG. 6, each adjacent wordline driver receives a signal from a different row decoder. Accordingly, the wordline drivers 24A and 24B receive the inverted enable signal $\overline{LT0}$ from the row decoder 16A. The placement of the wordline drivers 24A and 24B is arranged such that they are interleaved with the wordline drivers 24E and 24F which receive the inverted enable signal $\overline{LT1}$ from the row decoder 16B.

In the present example, the wordline WL0 is selected, as indicated in FIG. 7. Accordingly, the wordline WL1 is not selected. However, as previously described, the parasitic capacitance 42A between the wordline WL0 and the wordline WL1 provides a noise path which results in coupling noise on WL1. However, unlike the embodiment described with reference to FIG. 5, because the wordline driver 24E (arranged to drive the wordline WL1) is coupled to an inactive row decoder, the coupling noise may be more significantly reduced through the large transistor 38E as indicated by the current noise path 46. Based on the state of the transistors 36E, 38E and 40E, due to the inactive signals $\overline{LT1}$ and PH4, the transistor 38 E is open and therefore, provides a stronger path to ground such that increases in the coupling noise between active and inactive wordlines can be more effectively reduced and/or eliminated.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory device comprising:
  a first plurality of wordline drivers, wherein each of the first plurality of wordline drivers is configured to receive an enable signal from a first row decoder and configured to drive a respective wordline; and
  a second plurality of wordline drivers, wherein each of the second plurality of wordline drivers is configured to receive an enable signal from a second row decoder and configured to drive a respective wordline, and
  wherein the first plurality of wordline drivers is interleaved with the second plurality of wordline drivers; and
  wherein each of the first plurality of wordline drivers and each of the second plurality of wordline drivers comprises:
    a first transistor, wherein a first terminal of the first transistor is coupled to a phase driver and wherein a second terminal of the first transistor is coupled to the respective wordline;
    a second transistor, wherein a first terminal of the second transistor is coupled to the second terminal of the first transistor and a second terminal of the second transistor is coupled to ground, and wherein a gate of the first transistor is coupled to the gate of the second transistor and configured to receive a signal from one of the first and second row decoder; and
    a third transistor, wherein a first terminal of the third transistor is coupled to the first terminal of the second transistor and wherein a second terminal of the third transistor is coupled to ground; and
  wherein a current capability of the second transistor is greater than a current capability of the third transistor.

2. The memory device, as set forth in claim 1, wherein the first transistor comprises a p-channel MOSFET and each of the second transistor and third transistor comprises an n-channel MOSFET.

3. The memory device, as set forth in claim 1, wherein a current capability of the second transistor is at least four times greater than a current capability of the third transistor.

4. A memory device comprising:
  a first plurality of wordline drivers, wherein each of the first plurality of wordline drivers is configured to receive an enable signal from a first row decoder and configured to drive a respective wordline; and
  a second plurality of wordline drivers, wherein each of the second plurality of wordline drivers is configured to receive an enable signal from a second row decoder and configured to drive a respective wordline, and
  wherein the first plurality of wordline drivers is interleaved with the second plurality of wordline drivers, and
  wherein each of the first plurality of wordline drivers and each of the second plurality of wordline drivers comprises:
    a first transistor coupled between the respective wordline and ground; and
    a second transistor coupled between the respective wordline and ground; and
    wherein a current capability of the first transistor is greater than a current capability of the second transistor.

5. The memory device, as set forth in claim 4, wherein the first transistor comprises an n-channel MOSFET and the second transistor comprises an n-channel MOSFET.

6. The memory device, as set forth in claim 4, wherein a current capability of the first transistor is at least four times greater than a current capability of the second transistor.

7. A memory device comprising:
  a first wordline driver coupled to a first wordline and configured to receive a first enable signal from a first row decoder;
  a second wordline driver coupled to a second wordline and configured to receive a second enable signal from a second row decoder, wherein the second wordline is immediately adjacent to the first wordline; and
  a third wordline driver coupled to a third wordline and configured to receive the first enable signal from the first row decoder, wherein the third wordline is immediately adjacent to the second wordline;

wherein each of the first, second and third wordline drivers comprises:

a first transistor, wherein a first terminal of the first transistor is coupled to a phase driver and wherein a second terminal of the first transistor is coupled to the respective wordline;

a second transistor, wherein a first terminal of the second transistor is coupled to the second terminal of the first transistor and a second terminal of the second transistor is coupled to ground, and wherein a gate of the first transistor is coupled to the gate of the second transistor and configured to receive a signal from one of the first and second row decoder; and a third transistor, wherein a first terminal of the third transistor is coupled to the first terminal of the second transistor and wherein a second terminal of the third transistor is coupled to ground; and wherein a current capability of the second transistor is greater than a current capability of the third transistor.

8. The memory device, as set forth in claim 7, wherein the first transistor comprises a p-channel MOSFET and each of the second transistor and third transistor comprises an n-channel MOSFET.

9. The memory device, as set forth in claim 8, wherein a current capability of the second transistor is at least four times greater than a current capability of the third transistor.

10. A memory device comprising:

a first wordline driver coupled to a first wordline and configured to receive a first enable signal from a first row decoder;

a second wordline driver coupled to a second wordline and configured to receive a second enable signal from a second row decoder, wherein the second wordline is immediately adjacent to the first wordline; and a third wordline driver coupled to a third wordline and configured to receive the first enable signal from the first row decoder, wherein the third wordline is immediately adjacent to the second wordline;

wherein each of the first, second and third wordline drivers comprises:

a first transistor, wherein a first terminal of the first transistor is coupled to a phase driver and wherein a second terminal of the first transistor is coupled to the respective wordline;

a second transistor, wherein a first terminal of the second transistor is coupled to the second terminal of the first transistor and a second terminal of the second transistor is coupled to ground, and wherein a gate of the first transistor is coupled to the gate of the second transistor and configured to receive a signal from one of the first and second row decoder; and a third transistor, wherein a first terminal of the third transistor is coupled to the first terminal of the second transistor and wherein a second terminal of the third transistor is coupled to ground; and wherein the second wordline driver is configured such that when the first wordline is selected, coupling noise on the second wordline is sunk to ground through the second transistor.

11. A memory device comprising:

a first wordline driver coupled to a first wordline and configured to receive a first enable signal from a first row decoder;

a second wordline driver coupled to a second wordline and configured to receive a second enable signal from a second row decoder, wherein the second wordline is immediately adjacent to the first wordline; and a third wordline driver coupled to a third wordline and configured to receive the first enable signal from the first row decoder, wherein the third wordline is immediately adjacent to the second wordline; and wherein each of the first wordline driver and the second wordline driver comprises:

a first transistor coupled between the respective wordline and ground; and a second transistor coupled between the respective wordline and grounds;

wherein a current capability of the first transistor is greater than a current capability of the second transistor.

12. The memory device, as set forth in claim 11, wherein the first transistor comprises an n-channel MOSFET and the second transistor comprises an n-channel MOSFET.

13. The memory device, as set forth in claim 11, wherein a current capability of the first transistor is at least four times greater than a current capability of the second transistor.

14. A memory device comprising:

a memory array;

a plurality of wordlines coupled to the memory array;

a plurality of wordline drivers, wherein one of the plurality of wordline drivers is coupled to a respective one of the plurality of wordlines; and a plurality of row decoders, wherein each of the plurality of row decoders is coupled to at least two of the plurality of wordline drivers, wherein the at least two of the plurality of wordline drivers are coupled to non-adjacent wordlines;

wherein each of the plurality of wordline drivers comprises:

a first transistor, wherein a first terminal of the first transistor is coupled to a phase driver and wherein a second terminal of the first transistor is coupled to the respective one of the plurality of wordlines;

a second transistor, wherein a first terminal of the second transistor is coupled to the second terminal of the first transistor and a second terminal of the second transistor is coupled to ground, and wherein a gate of the first transistor is coupled to the gate of the second transistor and configured to receive a signal from one of the plurality of row decoders; and a third transistor, wherein a first terminal of the third transistor is coupled to the first terminal of the second transistor and wherein a second terminal of the third transistor is coupled to ground; and wherein a current capability of the second transistor is greater than a current capability of the third transistor.

15. The memory device, as set forth in claim 14, wherein the memory array comprises a dynamic random access memory (DRAM) array.

16. The memory device, as set forth in claim 14, wherein the first transistor comprises a p-channel MOSFET and each of the second transistor and third transistor comprises an n-channel MOSFET.

17. The memory device, as set forth in claim 14, wherein a current capability of the second transistor is at least four times greater than a current capability of the third transistor.

18. A memory device comprising:
- a memory array;
- a plurality of wordlines coupled to the memory array;
- a plurality of wordline drivers, wherein one of the plurality of wordline drivers is coupled to a respective one of the plurality of wordlines; and
- a plurality of row decoders, wherein each of the plurality of row decoders is coupled to at least two of the plurality of wordline drivers, wherein the at least two of the plurality of wordline drivers are coupled to non-adjacent wordlines, wherein each of the plurality of wordline drivers comprises:
  - a first transistor, wherein a first terminal of the first transistor is coupled to a phase driver and wherein a second terminal of the first transistor is coupled to the respective one of the plurality of wordlines;
  - a second transistor, wherein a first terminal of the second transistor is coupled to the second terminal of the first transistor and a second terminal of the second transistor is coupled to ground, and wherein a gate of the first transistor is coupled to the gate of the second transistor and configured to receive a signal from one of the plurality of row decoders; and
  - a third transistor, wherein a first terminal of the third transistor is coupled to the first terminal of the second transistor and wherein a second terminal of the third transistor is coupled to ground; and
- wherein the second wordline driver is configured such that when the first wordline is selected, coupling noise on the second wordline is sunk to ground through the second transistor.

19. A memory device comprising:
- a memory array;
- a plurality of wordlines coupled to the memory array;
- a plurality of wordline drivers, wherein one of the plurality of wordline drivers is coupled to a respective one of the plurality of wordlines; and
- a plurality of row decoders, wherein each of the plurality of row decoders is coupled to at least two of the plurality of wordline drivers, wherein the at least two of the plurality of wordline drivers are coupled to non-adjacent wordlines;
- wherein the memory array comprises a dynamic random access memory (DRAM) array; and
- wherein each of the first plurality of wordline drivers and each of the second plurality of wordline drivers comprises:
  - a first transistor coupled between the respective wordline and ground; and
  - a second transistor coupled between the respective wordline and ground; and
  - wherein a current capability of the first transistor is greater than a current capability of the second transistor.

20. The memory device, as set forth in claim 19, wherein the first transistor comprises an n-channel MOSFET and the second transistor comprises an n-channel MOSFET.

21. The memory device, as set forth in claim 19, wherein a current capability of the first transistor is at least four times greater than a current capability of the second transistor.

* * * * *